United States Patent
Zhou et al.

(10) Patent No.: US 11,149,937 B2
(45) Date of Patent: Oct. 19, 2021

(54) FUNCTIONALLY GRADED MANIFOLD MICROCHANNEL HEAT SINKS

(71) Applicant: TOYOTA MOTOR ENGINEERING & MANUFACTURING NORTH AMERICA, INC., Plano, TX (US)

(72) Inventors: Yuqing Zhou, Ann Arbor, MI (US); Ercan Mehmet Dede, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 16/777,403

(22) Filed: Jan. 30, 2020

(65) Prior Publication Data

US 2021/0239310 A1 Aug. 5, 2021

(51) Int. Cl.

| | |
|---|---|
| *F21V 29/75* | (2015.01) |
| *H01L 23/467* | (2006.01) |
| *H01L 23/473* | (2006.01) |
| *H01L 23/427* | (2006.01) |

(52) U.S. Cl.
CPC ............ *F21V 29/75* (2015.01); *H01L 23/467* (2013.01); *H01L 23/473* (2013.01); *H01L 23/427* (2013.01); *H01L 2924/0002* (2013.01)

(58) Field of Classification Search
CPC ..... F21V 29/75; H01L 23/467; H01L 23/473; H01L 23/427; H01L 2924/0002
See application file for complete search history.

(56) References Cited

U.S. PATENT DOCUMENTS

| | | | |
|---|---|---|---|
| 5,810,072 A | 9/1998 | Rees et al. | |
| 9,233,438 B2* | 1/2016 | Phelan | F28F 3/02 |
| 10,080,311 B1 | 9/2018 | Musiol | |
| 2004/0188066 A1* | 9/2004 | Upadhya | F28D 15/0266 165/80.4 |
| 2005/0081552 A1* | 4/2005 | Nilson | F28D 15/043 62/311 |
| 2005/0092007 A1* | 5/2005 | Gutfeld | H01L 23/473 62/259.2 |

(Continued)

FOREIGN PATENT DOCUMENTS

CN 110055563 A 7/2019

*Primary Examiner* — Stephen S Sul
*Assistant Examiner* — Michael A Matey
(74) *Attorney, Agent, or Firm* — Dinsmore & Shohl, LLP (57) ABSTRACT

Embodiments disclosed herein describe a manifold microchannel heat sink having a target surface, a microchannel structure and an insert disposed over the microchannel structure. The microchannel structure includes a plurality of fins extending in a normal direction from the target surface and defining a plurality of microchannels. The individual fins are shaped as rectangular plates and the individual microchannels comprise gaps between the individual fins. The plurality of fins are distributed on the target surface such that at least a thickness of the individual fins or a width of the gaps comprising the individual microchannels is varied along a plane of the target surface. The insert disposed over the microchannel structure has a plurality of inlet dividers and a plurality of outlet dividers. The individual inlet dividers define an inlet channel and the individual outlet dividers define an outlet channel.

20 Claims, 11 Drawing Sheets

(56) References Cited

U.S. PATENT DOCUMENTS

| | | | |
|---|---|---|---|
| 2008/0237847 A1* | 10/2008 | Nakanishi | H01L 23/473 257/722 |
| 2008/0308258 A1* | 12/2008 | Pan | H01L 23/473 165/104.19 |
| 2010/0282454 A1* | 11/2010 | Jiang | F28F 9/0273 165/175 |
| 2011/0079370 A1 | 4/2011 | Wen et al. | |
| 2014/0029199 A1* | 1/2014 | Dede | F28F 3/048 361/699 |
| 2015/0348869 A1* | 12/2015 | Joshi | H01L 25/07 361/700 |
| 2017/0055378 A1* | 2/2017 | Zhou | H05K 7/20927 |
| 2018/0024599 A1* | 1/2018 | Sakata | H01L 21/4878 361/679.47 |
| 2018/0145010 A1* | 5/2018 | Fukuoka | H01L 23/467 |
| 2018/0177076 A1* | 6/2018 | Leighton | H01L 23/473 |
| 2019/0082560 A1* | 3/2019 | Dede | B22F 7/002 |
| 2020/0227341 A1* | 7/2020 | Neal | H01L 23/4336 |

\* cited by examiner

FUNCTIONALLY GRADED MANIFOLD MICROCHANNEL HEAT SINKS

TECHNICAL FIELD

The present specification generally relates to cooling structures for electronics modules and, more specifically to, manifold microchannel heat sinks having a microchannel structure with functionally graded fin geometries and an insert having functionally graded inlet and outlet dividers disposed over the microchannel structure for cooling heat-generating devices in the electronics modules.

BACKGROUND

Heat sinking devices may be coupled to a heat-generating device, such as a power electronics device, to remove heat and lower the maximum operating temperature of the heat-generating device. Cooling fluid may be used to receive heat generated by the heat-generating device by convective thermal transfer, and remove such heat from the heat-generating device. For example, cooling fluid may be directed toward a semiconductor cooling chip to remove heat from the heat-generating device. For small electronic devices such as integrated circuits, a microchannel heat sink may be used to accommodate the small size of these devices.

Power electronics devices are designed to operate at increased power levels and generate increased heat flux due to the demands of newly-developed electrical systems. Conventional heat sinks may be unable to adequately remove sufficient heat to effectively lower the operating temperature of the electronic assemblies to acceptable temperature levels. Further, conventional heat sinks and cooling structures may require additional bonding layers and thermal matching materials (e.g., bond layers, substrates, thermal interface materials). These additional layers and other factors add packaging size and substantial thermal resistance to the overall electronics modules and make their thermal management challenging.

Due to the trending demand of high efficiency, integrated functionality and compact form factor, the power density of power electronics devices has been inevitably increasing. As a result, the thermal management of such power-dense electronics modules requires higher heat dissipation capability with balanced pumping power requirement. Accordingly, innovative cooling solutions are desirable to address the thermal management requirements of these power-dense electronics modules.

SUMMARY

The present specification relates to manifold microchannel heat sinks having a microchannel structure with functionally graded fin geometries and an insert having functionally graded inlet and outlet dividers disposed over the microchannel structure for cooling heat-generating devices in the electronics modules. In one embodiment, a manifold microchannel heat sink includes a target surface, a microchannel structure and an insert disposed over the microchannel structure. The microchannel structure includes a plurality of fins extending in a normal direction from the target surface and defining a plurality of microchannels. The individual fins are shaped as rectangular plates and the individual microchannels comprise gaps between the individual fins. The plurality of fins are distributed on the target surface such that at least a thickness of the individual fins or a width of the gaps comprising the individual microchannels is varied along a plane of the target surface. The insert disposed over the microchannel structure has a plurality of inlet dividers and a plurality of outlet dividers. The individual inlet dividers define an inlet channel and the individual outlet dividers define an outlet channel.

In another embodiment, an electronics module is disclosed. The electronics module includes a manifold microchannel heat sink having a target surface and a semiconductor device thermally coupled to the target surface. The manifold microchannel heat sink includes the target surface, a microchannel structure and an insert disposed over the microchannel structure. The microchannel structure includes a plurality of fins extending in a normal direction from the target surface and defining a plurality of microchannels. The individual fins are shaped as rectangular plates and the individual microchannels comprise gaps between the individual fins. The plurality of fins are distributed on the target surface such that at least a thickness of the individual fins or a width of the gaps comprising the individual microchannels is varied along a plane of the target surface. The insert disposed over the microchannel structure has a plurality of inlet dividers and a plurality of outlet dividers. The individual inlet dividers define an inlet channel and the individual outlet dividers define an outlet channel.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Various embodiments described herein are directed to manifold microchannel (MMC) heat sinks having a microchannel structure with functionally graded fin geometries and an insert having functionally graded inlet and outlet dividers disposed over the microchannel structure for cooling heat-generating devices in the electronics modules. The MMC heat sinks described herein control heat transfer and provide improved cooling performance, particularly for heat-generating devices with non-uniform heat flux. The improved cooling performance is achieved by varying a thickness of the individual fins, a width of the gaps comprising the individual microchannels between the individual fins, a thickness of the plurality of inlet dividers and the plurality of outlet dividers, and a width of the inlet channels formed by the inlet dividers and the outlet channels formed by the outlet dividers in the insert. The variation may be gradually increasing or decreasing along a direction or between different regions. The variation may also be tailored based on the number of heat-generating devices and their corresponding heat fluxes. Variation in a thickness of the individual fins and a width of the gaps comprising the individual microchannels between the individual fins results in a microchannel structure having non-uniform fin density, whereby regions of higher fin density remove more heat and regions of lower fin density remove lesser heat. On the other hand, variation in a thickness of the plurality of inlet dividers and the plurality of outlet dividers, and a width of the inlet channels formed by the inlet dividers and the outlet channels formed by the outlet dividers results in an insert with non-uniform channel density, whereby regions of higher channel density remove more heat and regions of lower channel density remove lesser heat. Accordingly, heat transfer coefficient can be controlled in the direction of the variation in fin density and the channel density respectively. Various other aspects of the disclosure and variations thereof are illustrated or implied through the descriptions of the embodiments below.

Figure 1:
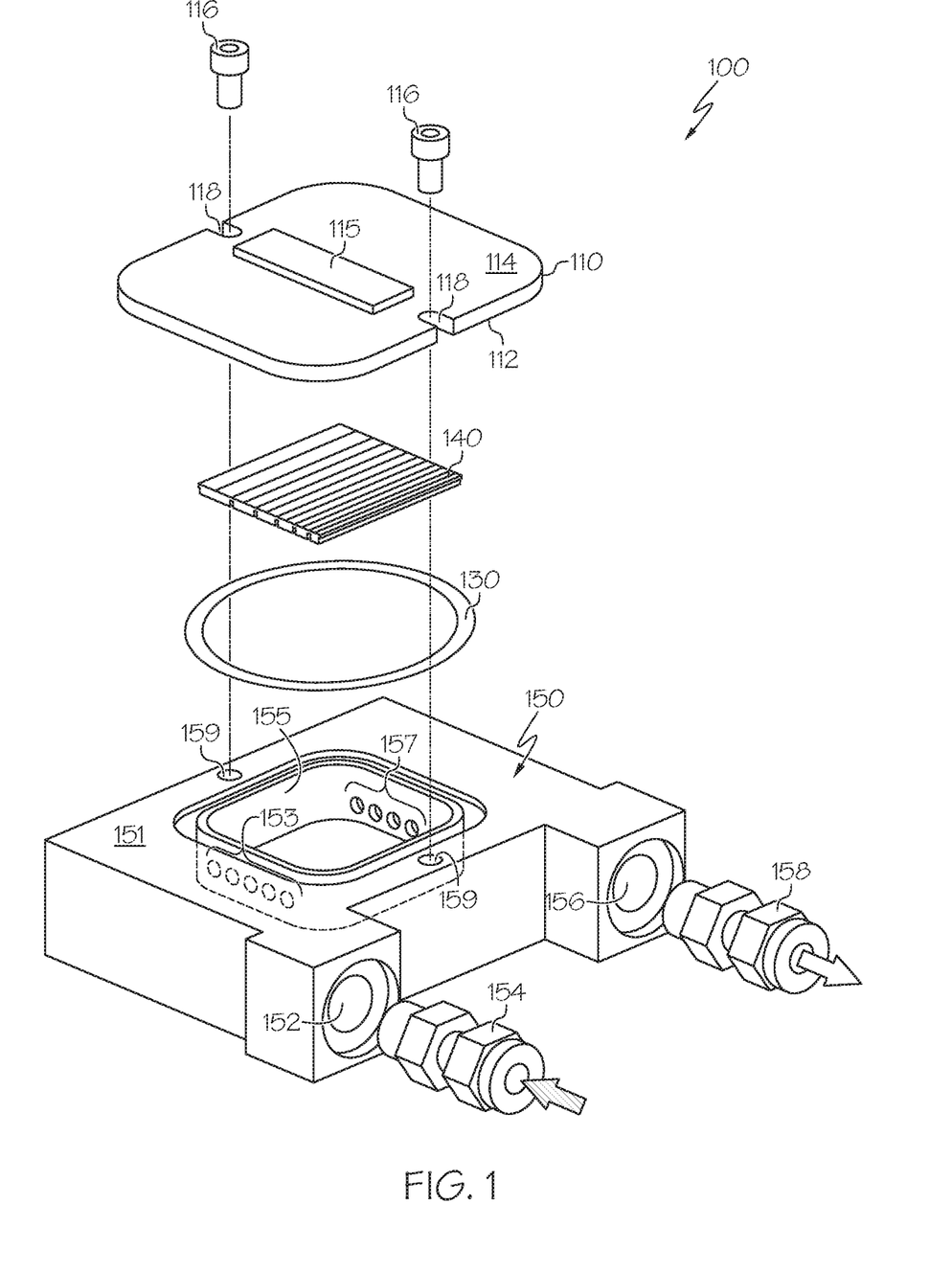
FIG. 1 depicts an exploded perspective view of an example manifold microchannel (MMC) heat sink assembly, according to one or more embodiments shown and described herein.

Referring to the figures, FIG. 1 depicts an exploded perspective view of an example manifold microchannel (MMC) heat sink assembly 100. The MMC heat sink assembly 100 includes an MMC heat sink 110. The example MMC heat sink 110 may be made of a thermally-conductive material, such as, but not limited to, aluminum, copper, nickel, and thermally conductive polymers. The MMC heat sink 110 has a target surface 112, two side notches 118 and a substrate surface 114 opposite to the target surface 112. The substrate surface 114 may have copper patterns on which one or more electronic devices 115 can be bonded. The electronic devices 115 may be a heat-generating semiconductor device such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the electronic device 115 may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, the electronic devices 115 operate at high current and under high temperatures, for example in excess of 250° C. and generate a large amount of heat flux that should be removed for its continued operation. As heat flows within the MMC heat sink 110 from the substrate surface 114 to the target surface 112, the electronic devices 115 are thermally coupled to the target surface 112.

The example MMC heat sink 110 further has a microchannel structure 220 (shown in FIG. 2, which depicts a top perspective view of the example MMC heat sink 110) and an insert 140. The microchannel structure 220 has a plurality of fins 230, which are shaped as rectangular plates and extend in a normal (+Z) direction from the target surface 112. The plurality of fins 230 define a plurality of microchannels 240 such that an individual microchannel 240 comprises a gap between adjacent individual fins 230. The microchannel structure 220 may be fabricated from a thermally-conductive metal such as, but not limited to, copper, nickel, and aluminum using advanced manufacturing processes such as, but not limited to, three-dimensional printing, rapid investment casting, and additive manufacturing.

Figure 2:
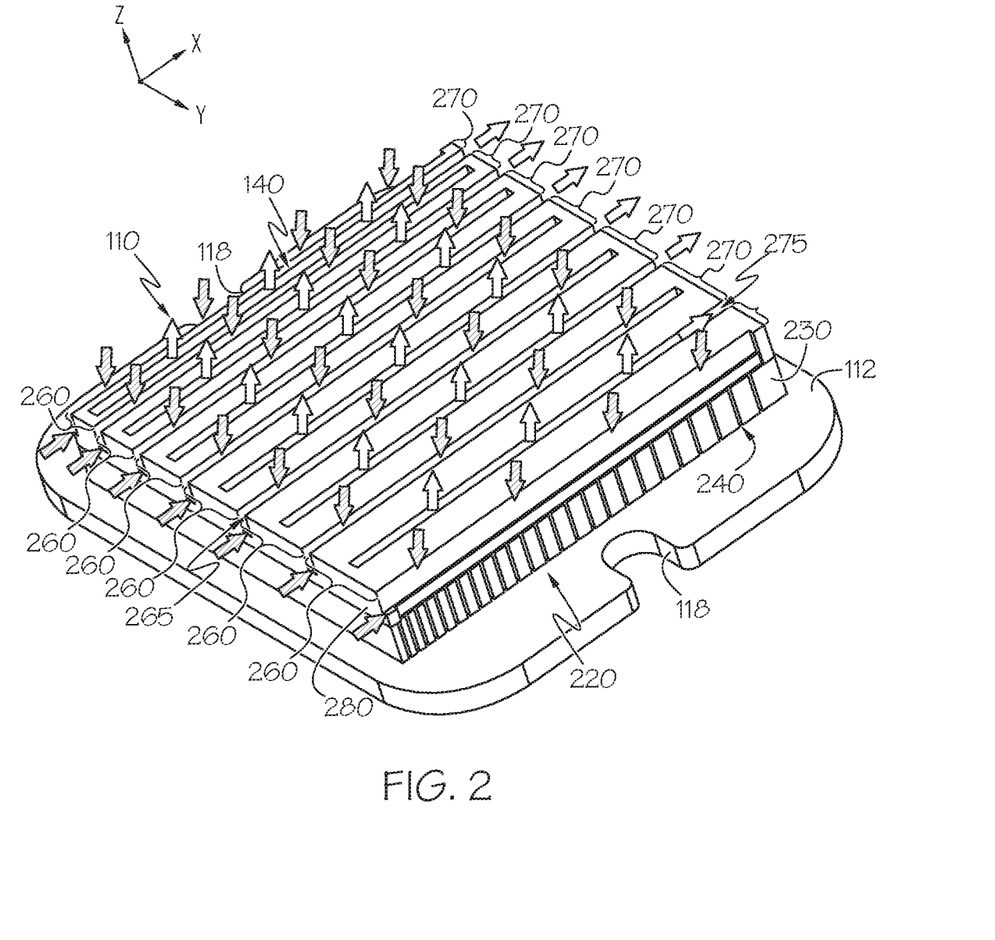
FIG. 2 depicts a top perspective view of an example MMC heat sink of the MMC heat sink assembly of FIG. 1, according to one or more embodiments shown and described herein.

The example insert 140 is disposed over the microchannel structure 220. As shown in FIG. 2, the insert 140 has one or more inlet dividers 260 that define inlet channels 265, one or more outlet dividers 270 that define outlet channels 275 and a base surface 280 through which it is mechanically connected to the microchannel structure 220 of the MMC heat sink 110. The insert 140 is configured to navigate the flow of a cooling fluid between the inlet channels 265 and the microchannel structure 220 as well as between the microchannel structure 220 and the outlet channels 275. In the non-limiting embodiment shown in FIG. 2, the inlet dividers 260 and the outlet dividers 270 have an alternating arrangement on the insert 140. Both the flow resistance of the cooling fluid flowing in the microchannel structure 220 and the temperature variation on the target surface 112 can be significantly minimized with the insert 140 having such an arrangement. The insert 140 may be formed from a thermally-insulating material such as, but not limited to, a plastic material.

Referring again to FIG. 1, the MMC heat sink assembly 100 further includes a heat exchanger manifold 150. The example heat exchanger manifold 150 has a top surface 151, an inlet manifold 152 and an outlet manifold 156. The inlet manifold 152 is fitted with an inlet fitting connector 154 and the outlet manifold 156 is fitted with an outlet fitting connector 158. The heat exchanger manifold 150 includes an aperture 155 opening into the top surface 151. The aperture 155 includes one or more inlet holes 153 fluidly connected to the inlet manifold 152 and one or more outlet holes 157 fluidly connected to the outlet manifold 156.

The top surface 151 of the heat exchanger manifold 150 also includes two through-holes 159 aligned with the two notches 118 of the MMC heat sink 110. Two fasteners 116 may be used to pass through the two notches 118 and the two through-holes 159 to mechanically couple the MMC heat sink 110 to the heat exchanger manifold 150 in a way such that the microchannel structure 220 is sealably disposed within the aperture 155 of the heat exchanger manifold 150 and the inlet dividers 260 and the outlet dividers 270 are fluidly connected to the inlet holes 153 and the outlet holes 157 respectively. In the non-limiting embodiment shown in FIG. 1, the seal used is an O-ring 130. Further, while in the non-limiting embodiment shown in FIG. 1, the MMC heat sink 110 is mechanically coupled to the heat exchanger manifold 150 using two fasteners 116 through the two notches 118 and the two through-holes 159, there may be more than two fasteners 116, notches 118 and through-holes 159 used in other embodiments. Other embodiments may apply other fastening techniques, as well.

A cooling fluid flows from a reservoir (not shown) into the aperture 155 through the inlet manifold 152 and the inlet holes 153, forming an inward flow path. The cooling fluid flows out from the aperture 155 to a heat exchanger (not shown) through the outlet manifold 156 and the outlet holes 157, forming an outward flow path. The cooling fluid is configured to absorb and transfer heat generated from the operation of the electronic device 115. The cooling fluid may be air, an electrically conductive fluid, such as an ethylene glycol mixture, water, etc. or a dielectric cooling fluid that undergoes single-phase cooling. In some embodiments, the cooling fluid may undergo two-phase cooling by transforming from a liquid phase to a vapor phase. In FIGS. 1-2, the inward flow path of the cooling fluid is shown in shaded arrow(s), while the outward flow path of the cooling fluid is shown in solid arrows.

Referring again to FIG. 2, the MMC heat sink 110 has the microchannel structure 220 on the target surface 112 and the insert 140 disposed on the microchannel structure 220. The cooling fluid in the inward flowing path enters the microchannel structure 220 through the inlet channels 265 (shown in shaded arrows) and exits the microchannel structure 220 through the outlet channels 275 (shown in solid arrows). Thus the insert 140 provides the cooling fluid to the microchannel structure 220 and also receives and removes the cooling fluid from the microchannel structure 220.

In operation, the cooling fluid flows through the inlet manifold 152 and the inlet holes 153 along the inward flow path into the MMC heat sink 110. The cooling fluid flows through the inlet channels 265 and down into the microchannel structure 220. The cooling fluid flows down and up through the microchannel structure 220. Subsequently, the cooling fluid is then forced into changing its direction (for example, by about 90 degrees) to exit through the outlet channels 275 of the insert 140 which is fluidly connected to the low pressure area in the outlet manifold 156. The cooling fluid flows upwards through the outlet channels 275 in a direction normal to the target surface 112 and then flows along the outward flow path of the MMC heat sink 110 through the outlet holes 157 to exit out of the outlet manifold 156.

Various embodiments of the MMC heat sinks, where a thickness of the individual fins in the microchannel structure 220, a width of the gaps comprising the individual microchannels between the individual fins, a thickness of the plurality of inlet dividers 260 and the plurality of outlet dividers 270 in the insert 140, and a width of the inlet channels 265 formed by the inlet dividers 260 and the outlet channels 275 formed by the outlet dividers 270 in the insert 140 are varied, are now described in detail.

Figure 3A:
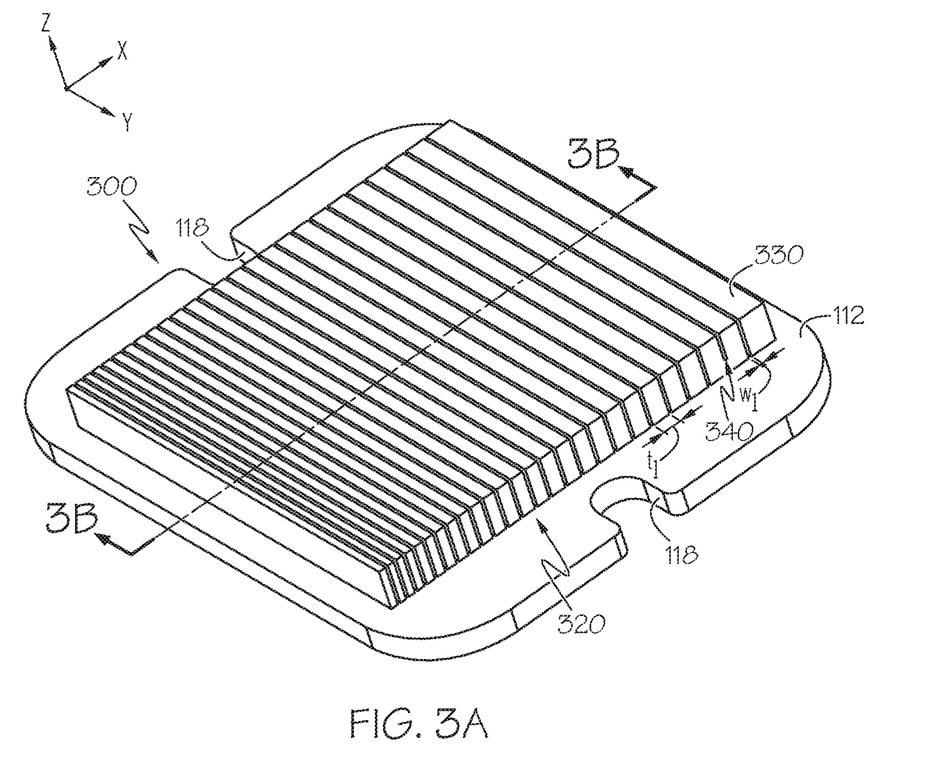
FIG. 3A depicts a top perspective view of an example microchannel structure in an MMC heat sink where a thickness of the individual ins of the MMC heat sink increases along a plane of the target surface, according to one or more embodiments shown and described herein.
Figure 3B:
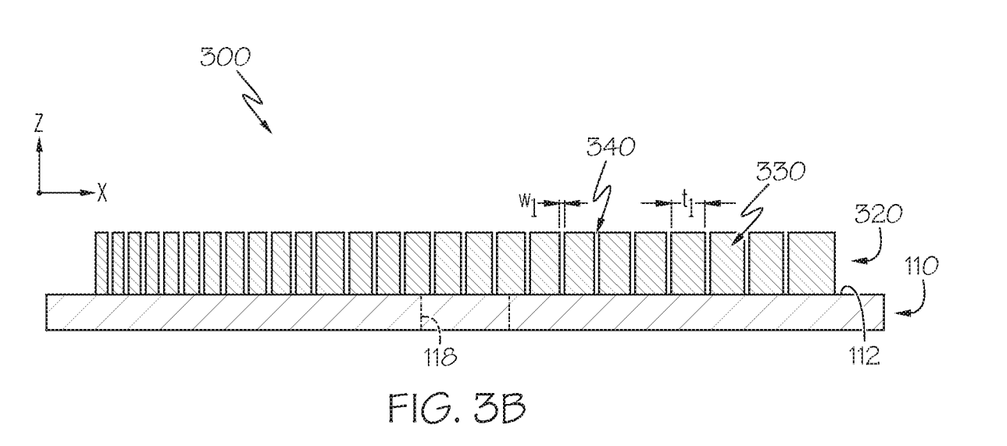
FIG. 3B depicts a cross-sectional view of the example microchannel structure of FIG. 3A, according to one or more embodiments shown and described herein.

FIGS. 3A-3B depict a top perspective view and a cross-sectional view respectively of an example microchannel structure 320 in an MMC heat sink 300 disposed along a plane of the target surface 112 which extends in the +X and +Y directions. The microchannel structure 320 of the MMC heat sink 300 has a plurality of fins 330, which are shaped as rectangular plates of thickness '$t_1$' and extend in a normal (+Z) direction from the target surface 112. The plurality of fins 330 define a plurality of microchannels 340 such that an individual microchannel 340 comprises a gap of width '$w_1$' between adjacent individual fins 330. In the non-limiting embodiment shown in FIGS. 3A-3B, the thickness $t_1$ of the individual fins 330 increases in the +X direction along the plane of the target surface 112, while the width $w_1$ of the individual microchannel 340 remains constant. Variation in the thickness $t_1$ of the individual fins 330 varies the fin density as a linear distribution along the +X direction, such that regions of higher fin density remove more heat and regions of lower fin density remove lesser heat.

Figure 4A:
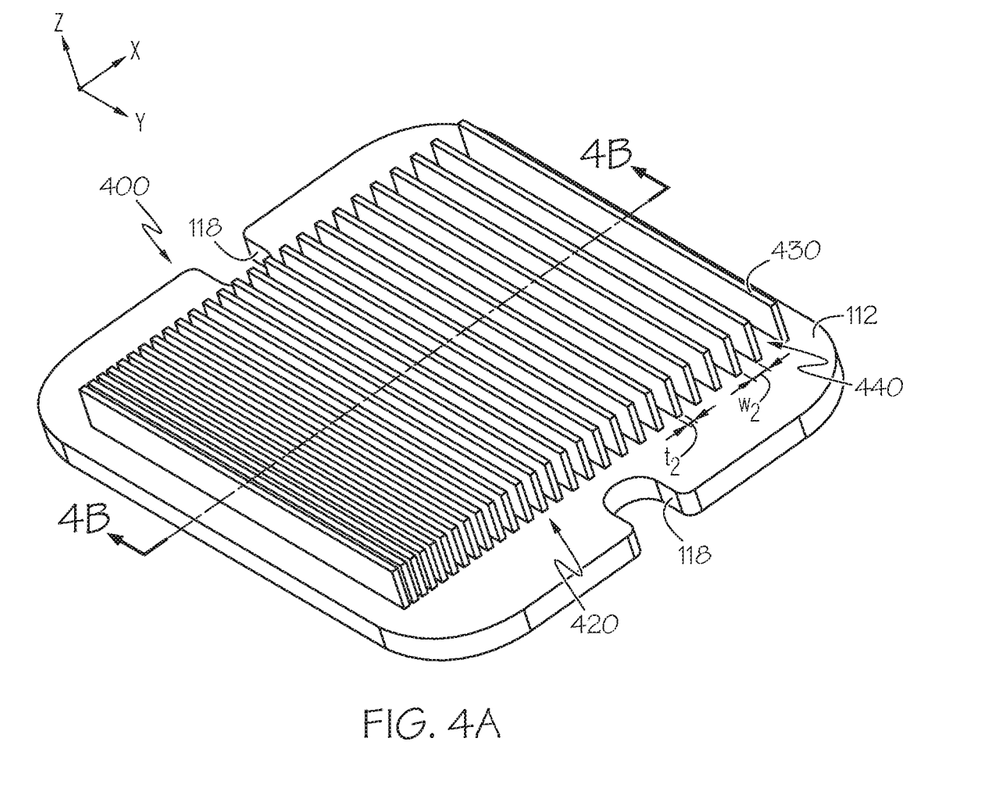
FIG. 4A depicts a top perspective view of an example microchannel structure in an MMC heat sink where a width of the gaps comprising the individual microchannels of the MMC heat sink increases along a plane of the target surface, according to one or more embodiments shown and described herein.
Figure 4B:
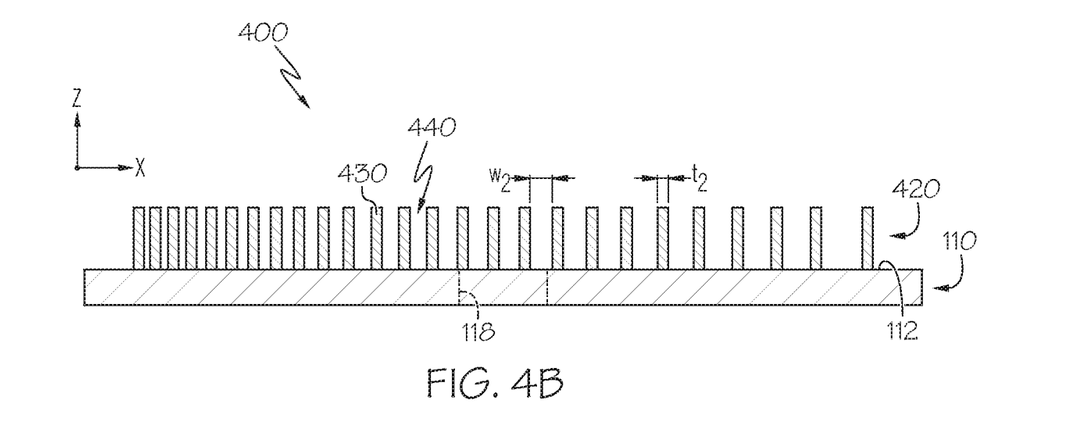
FIG. 4B depicts a cross-sectional view of the example microchannel structure of FIG. 4A, according to one or more embodiments shown and described herein.

FIGS. 4A-4B depict a top perspective view and a cross-sectional view respectively of another example microchannel structure 420 in an MMC heat sink 400 disposed along a plane of the target surface 112 which extends in the +X and +Y directions. The microchannel structure 420 of the MMC heat sink 400 has a plurality of fins 430, which are shaped as rectangular plates of thickness '$t_2$' and extend in a normal (+Z) direction from the target surface 112. The plurality of fins 430 define a plurality of microchannels 440 such that an individual microchannel 440 comprises a gap of width '$w_2$' between adjacent individual fins 430. In the non-limiting embodiment shown in FIGS. 4A-4B, the width $w_2$ of the individual microchannel 440 increases in the +X direction along the plane of the target surface 112, while the thickness $t_2$ of the individual fins 430 remains constant. Variation in the width $w_2$ of the individual microchannel 440 varies the fin density as a linear distribution along the +X direction, such that regions of higher fin density remove more heat and regions of lower fin density remove lesser heat.

Figure 5A:
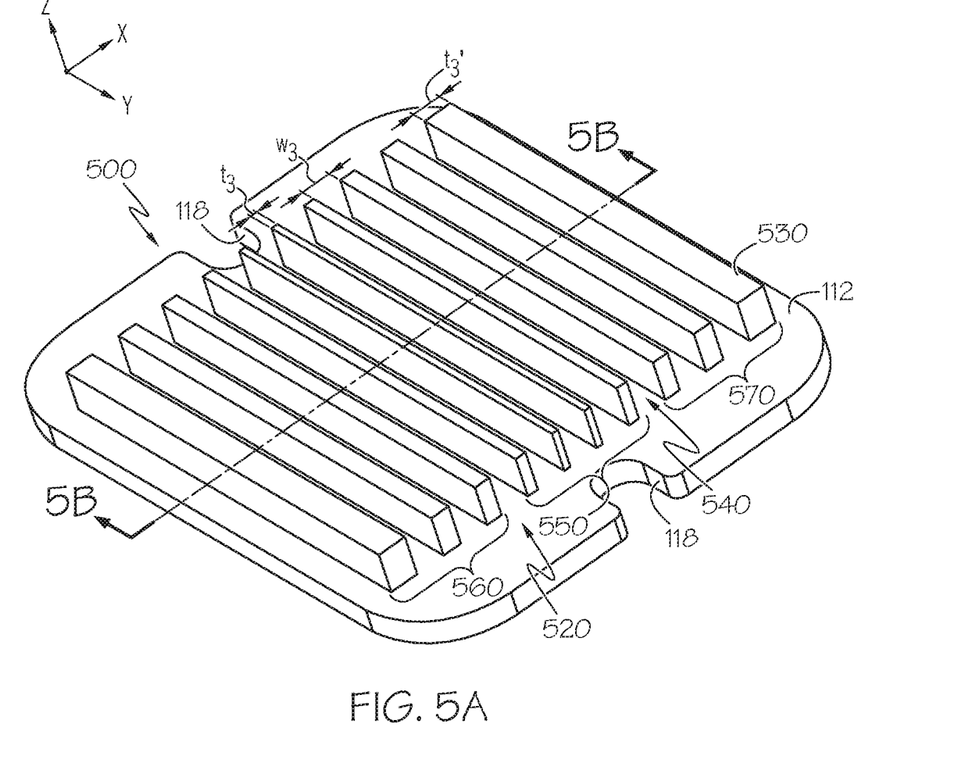
FIG. 5A depicts a top perspective view of an example microchannel structure in an MMC heat sink where a thickness of the individual fins in a central region of the microchannel structure of the MMC heat sink is less than a thickness of the individual fins on either ends of the microchannel structure along a plane of the target surface, according to one or more embodiments shown and described herein.
Figure 5B:
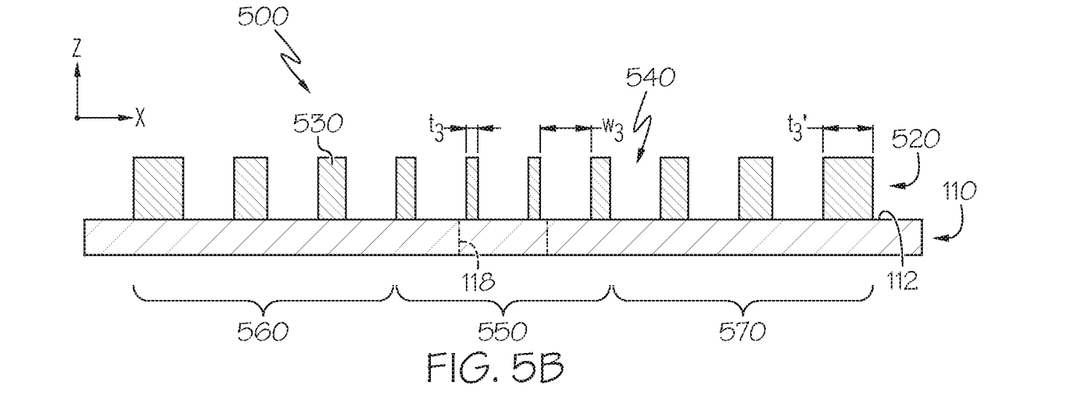
FIG. 5B depicts a cross-sectional view of the example microchannel structure of FIG. 5A, according to one or more embodiments shown and described herein.

FIGS. 5A-5B depict a top perspective view and a cross-sectional view respectively of yet another example microchannel structure 520 in an MMC heat sink 500 disposed along a plane of the target surface 112 which extends in the +X and +Y directions. The microchannel structure 520 of the MMC heat sink 500 has a plurality of fins 530, which are shaped as rectangular plates and extend in a normal (+Z) direction from the target surface 112. The plurality of fins 530 are have a thickness '$t_3$' in a central region 550 and a thickness '$t_3$'' at end regions 560 and 570 of the microchannel structure 520 on either side of the central region 550. The plurality of fins 530 define a plurality of microchannels 540 such that an individual microchannel 540 comprises a gap of width '$w_3$' between adjacent individual fins 530. In the non-limiting embodiment shown in FIGS. 5A-5B, along the +X direction, the thickness $t_3$ of the individual fins 530 in the central region 550 is less than a thickness $t_3'$ of the individual fins 530 in the end regions 560 and 570, while the width $w_3$ of the individual microchannel 540 remains constant. Variation between the thickness $t_3$ of the individual fins 530 at the central region 550 and the thickness $t_3'$ of the individual fins 530 at the end regions 560 and 570 varies the fin density as a normal distribution along the +X direction, such that regions of higher fin density remove more heat and regions of lower fin density remove lesser heat.

Figure 6A:
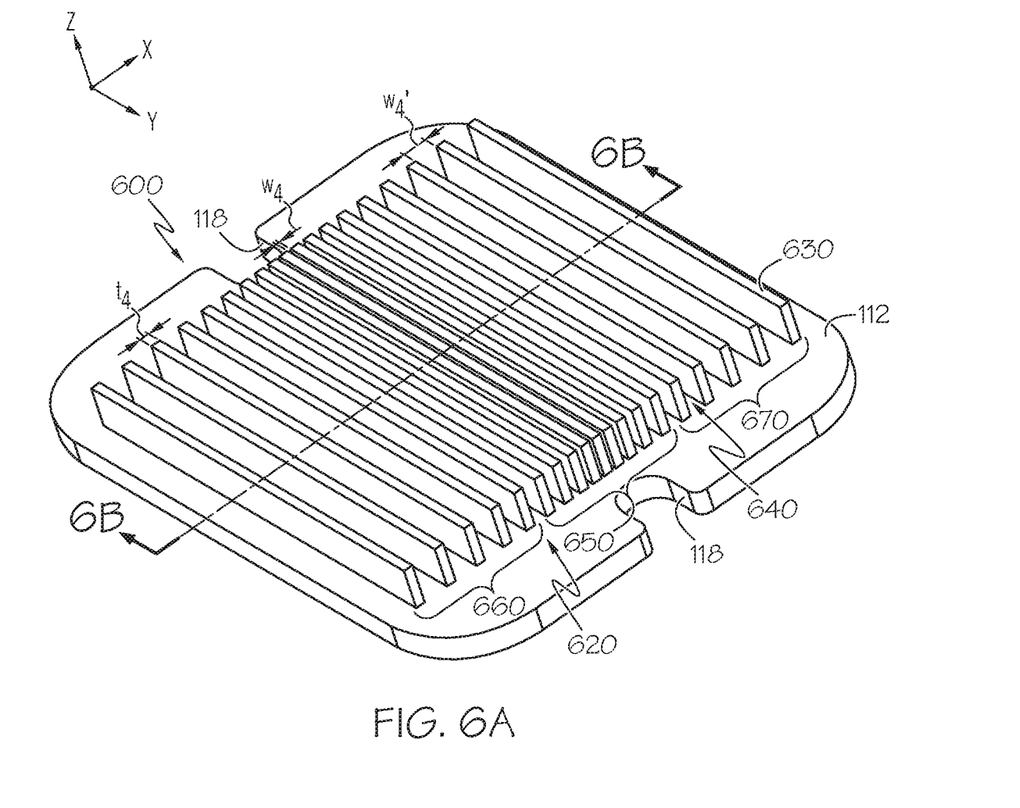
FIG. 6A depicts a top perspective view of an example microchannel structure in an MMC heat sink where a width of the gaps comprising the individual microchannels in a central region of the microchannel structure of the MMC heat sink is less than a width of the gaps comprising the individual microchannels on either ends of the microchannel structure along a plane of the target surface, according to one or more embodiments shown and described herein.
Figure 6B:
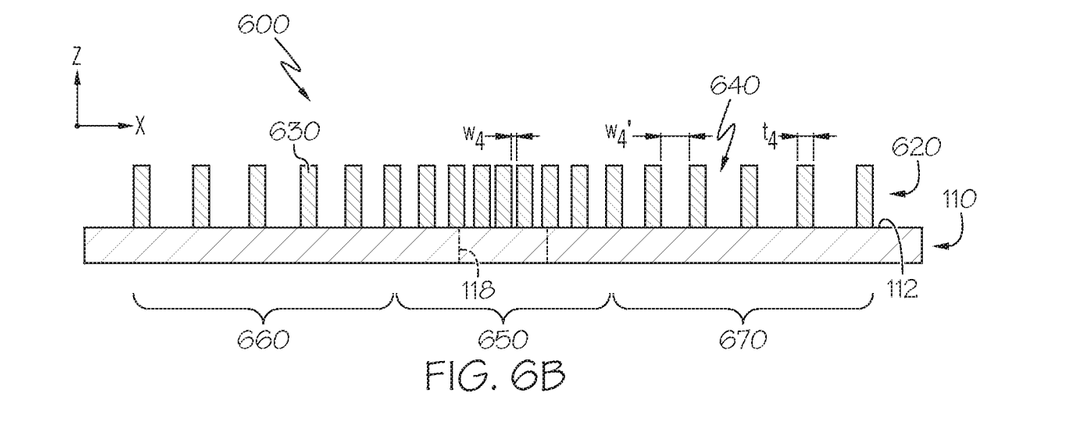
FIG. 6B depicts a cross-sectional view of the example microchannel structure of FIG. 6A, according to one or more embodiments shown and described herein.

FIGS. 6A-6B depict a top perspective view and a cross-sectional view respectively of yet another example microchannel structure 620 in an MMC heat sink 600 disposed along a plane of the target surface 112 which extends in the +X and +Y directions. The microchannel structure 620 of the MMC heat sink 600 has a plurality of fins 630, which are shaped as rectangular plates of thickness '$t_4$' and extend in a normal (+Z) direction from the target surface 112. The plurality of fins 630 define a plurality of microchannels 640 such that an individual microchannel 640 comprises a gap between adjacent individual fins 630. The individual microchannels have a width of '$w_4$' in a central region 650 and a width of '$w_4$'' at end regions 660 and 670 of the microchannel structure 620 on either side of the central region 650. In the non-limiting embodiment shown in FIGS. 6A-6B, along the +X direction, the width $w_4$ of the individual microchannel 640 in the central region 650 is less than a width $w_4'$ of the individual microchannel 640 in the end regions 660 and 670, while the thickness $t_4$ of the individual fins 630 remains constant. Variation between the width $w_4$ of the individual microchannel 640 in the central region 650 and the width $w_4'$ of the individual microchannel 640 in the end regions 660 and 670 varies the fin density as a normal distribution along the +X direction, such that regions of higher fin density remove more heat and regions of lower fin density remove lesser heat.

Figure 7A:
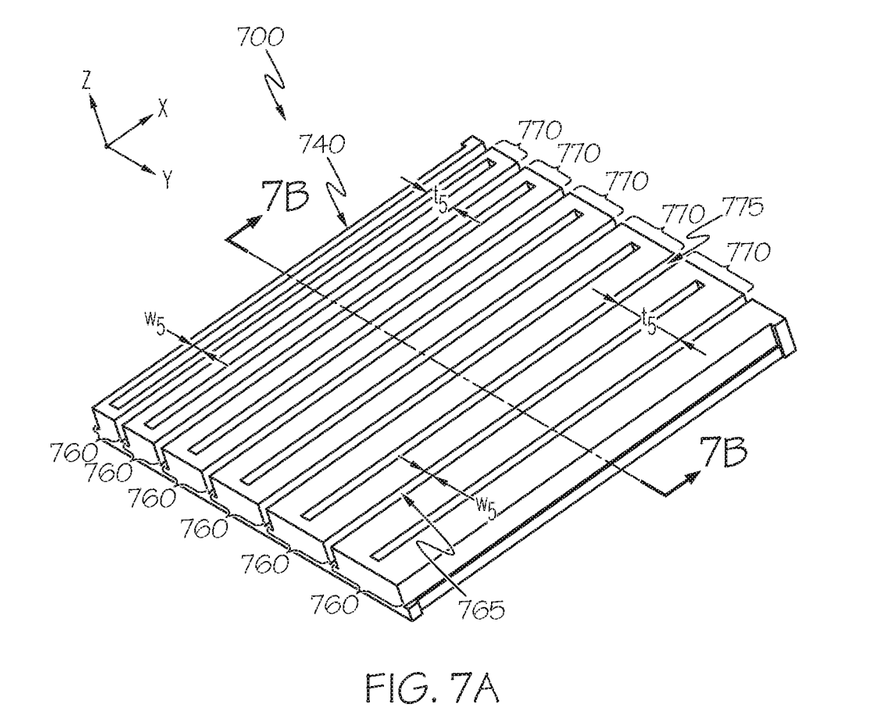
FIG. 7A depicts a top perspective view of an example insert in an MMC heat sink where a thickness of the plurality of inlet dividers and the plurality of outlet dividers in the insert increases in a direction parallel to a plane of the target surface, according to one or more embodiments shown and described herein.
Figure 7B:
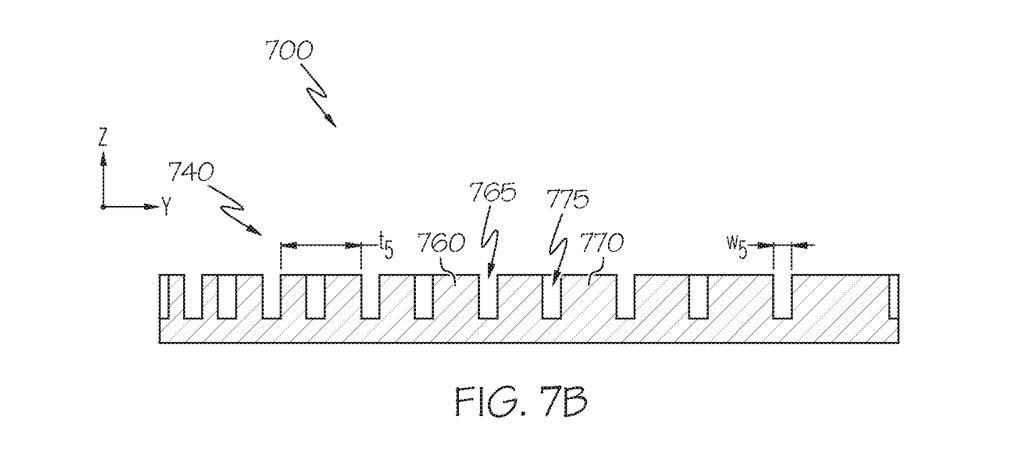
FIG. 7B depicts a cross-sectional view of the example insert in the MMC heat sink of FIG. 7A, according to one or more embodiments shown and described herein.

FIGS. 7A-7B depict a top perspective view and a cross-sectional view respectively of an example insert 740 in an MMC heat sink 700 disposed along a plane of the target surface 112 which extends in the +X and +Y directions. The insert 740 of the MMC heat sink 700 has a plurality of inlet dividers 760 and a plurality of outlet dividers 770 of thickness '$t_5$'. The plurality of inlet dividers 760 and the plurality of outlet dividers 770 extend in a normal (+Z) direction from the target surface 112. The plurality of inlet dividers 760 define inlet channels 765 and the plurality of outlet dividers 770 define the outlet channels 775 respectively. The inlet channels 765 and the outlet channels 775 have a width '$w_5$'. In the non-limiting embodiment shown in FIGS. 7A-7B, the thickness $t_5$ of the plurality of inlet dividers 760 and the plurality of outlet dividers 770 in the insert 740 increases in the +Y direction parallel to the plane of the target surface 112, while the width $w_5$ of the inlet channels 765 and the outlet channels 775 remains constant. Variation in the thickness $t_5$ of the plurality of inlet dividers 760 and the plurality of outlet dividers 770 varies the channel density as a linear distribution along the +Y direction, such that regions of higher channel density remove more heat and regions of lower channel density remove lesser heat.

Figure 8A:
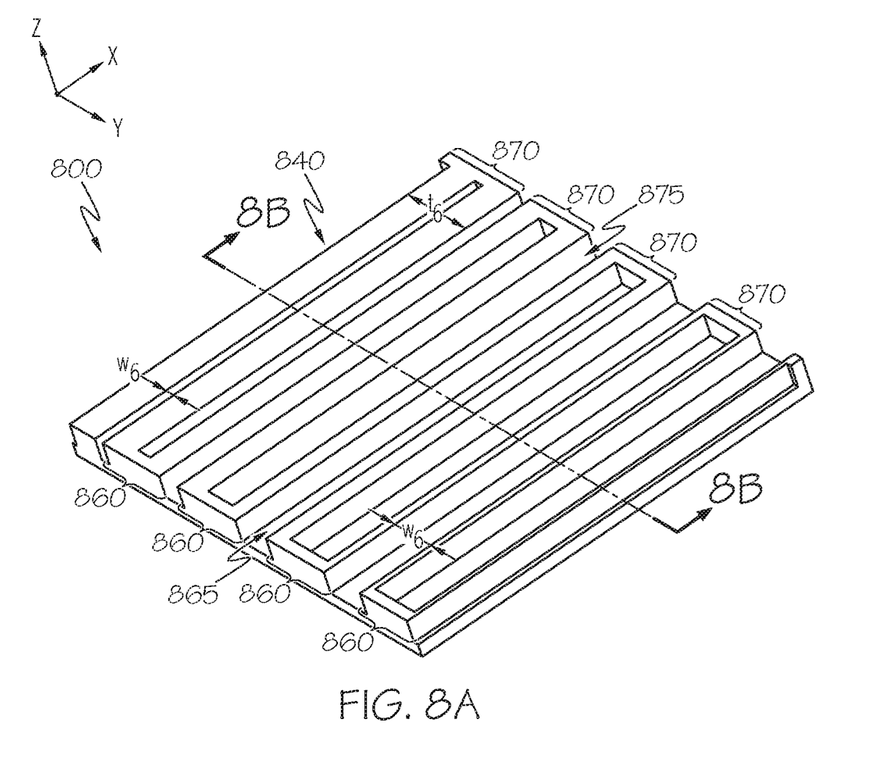
FIG. 8A depicts a top perspective view of an example insert in an MMC heat sink where a width of the inlet channels and the outlet channels in the insert increases in a direction parallel to a plane of the target surface, according to one or more embodiments shown and described herein.
Figure 8B:
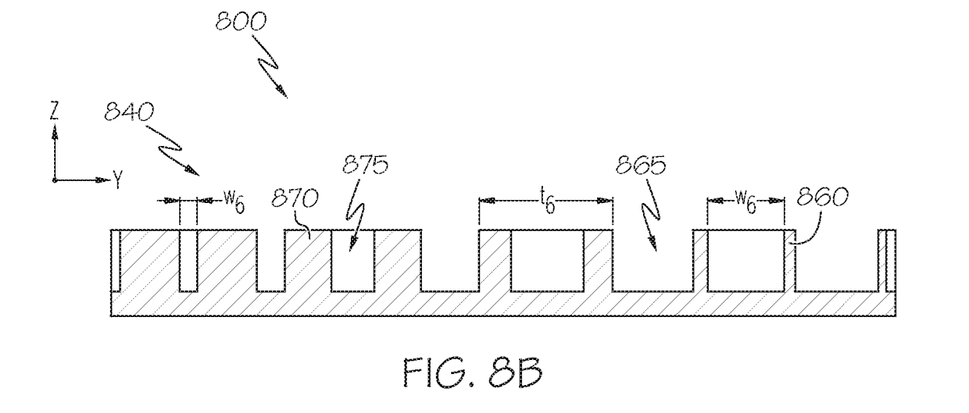
FIG. 8B depicts a cross-sectional view of the example insert in the MMC heat sink of FIG. 8A, according to one or more embodiments shown and described herein.

FIGS. 8A-8B depict a top perspective view and a cross-sectional view respectively of another example insert 840 in an MMC heat sink 800 disposed along a plane of the target surface 112 which extends in the +X and +Y directions. The insert 840 of the MMC heat sink 800 has a plurality of inlet dividers 860 and a plurality of outlet dividers 870 of thickness $t_6'$. The plurality of inlet dividers 860 and the plurality of outlet dividers 870 extend in a normal (+Z) direction from the target surface 112. The plurality of inlet dividers 860 define inlet channels 865 and the plurality of outlet dividers 870 define the outlet channels 875 respectively. The inlet channels 865 and the outlet channels 875 have a width '$w_6$'. In the non-limiting embodiment shown in FIGS. 8A-8B, the width $w_6$ of the inlet channels 865 and the outlet channels 875 in the insert 840 increases in the +Y direction parallel to the plane of the target surface 112, while the thickness $t_6$ of the plurality of inlet dividers 860 and the plurality of outlet dividers 870 in the insert 840 remains constant. Variation in the width $w_6$ of the inlet channels 865 and the outlet channels 875 in the insert 840 varies the channel density as a linear distribution along the +Y direction, such that regions of higher channel density remove more heat and regions of lower channel density remove lesser heat.

Figure 9A:
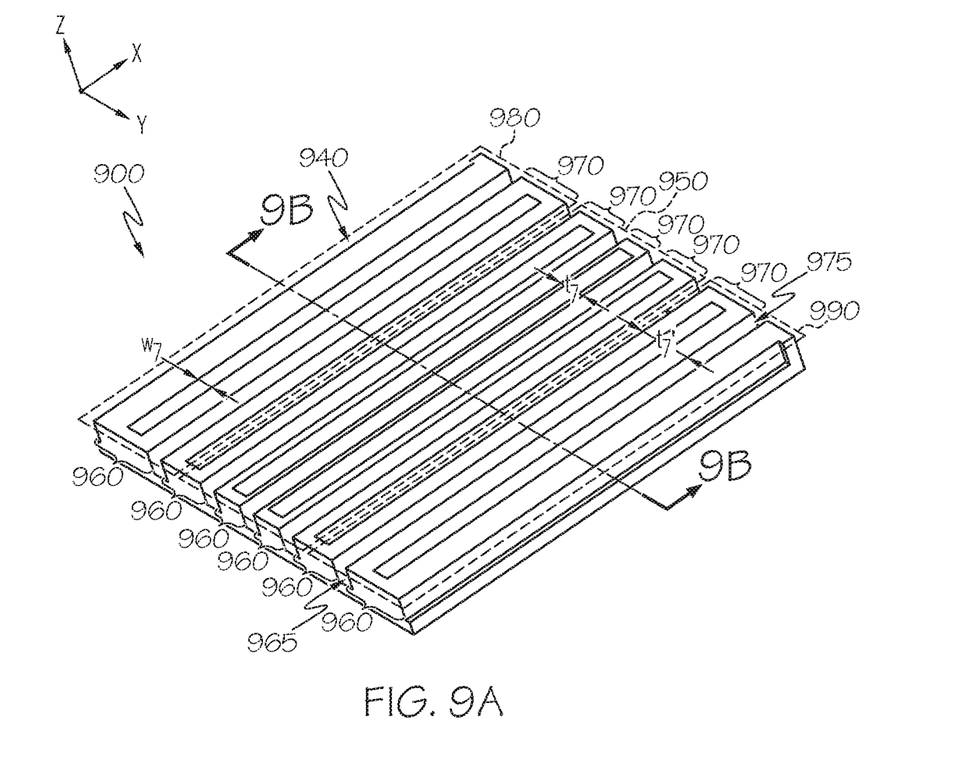
FIG. 9A depicts a top perspective view of an example insert in an MMC heat sink where a thickness of the plurality of inlet dividers and the plurality of outlet dividers in a central region of the insert is less than a thickness of the plurality of inlet dividers and the plurality of outlet dividers on either ends of the insert parallel to a plane of the target surface, according to one or more embodiments shown and described herein.
Figure 9B:
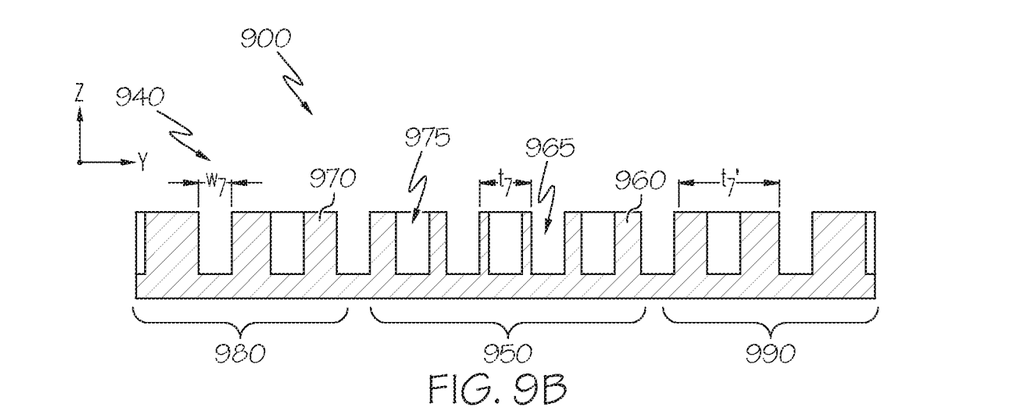
FIG. 9B depicts a cross-sectional view of the example insert in the MMC heat sink of FIG. 9A, according to one or more embodiments shown and described herein

FIGS. 9A-9B depict a top perspective view and a cross-sectional view respectively of yet another example insert 940 in an MMC heat sink 900 disposed along a plane of the target surface 112 which extends in the +X and +Y directions. The insert 940 of the MMC heat sink 900 has a plurality of inlet dividers 960 and a plurality of outlet dividers 970 extending in a normal (+Z) direction from the target surface 112. The plurality of inlet dividers 960 and the plurality of outlet dividers 970 have a thickness $t_7'$ in a central region 950 and a thickness '$t_7$'' in end regions 980 and 990 of the insert 940 on either side of the central region 950. The plurality of inlet dividers 960 define inlet channels 965 and the plurality of outlet dividers 970 define the outlet channels 975 respectively. The inlet channels 965 and the outlet channels 975 have a width '$w_7$'. In the non-limiting embodiment shown in FIGS. 9A-9B, along the +Y direction, the thickness $t_7$ of the plurality of inlet dividers 960 and the plurality of outlet dividers 970 in the central region 950 of the insert 940 is less than the thickness $t_7'$ of the plurality of inlet dividers 960 and the plurality of outlet dividers 970 on the end regions 980 and 990 of the insert 940, while the width $w_7$ of the inlet channels 965 and the outlet channels 975 remains constant. Variation between the thickness $t_7$ of the plurality of inlet dividers 960 and the plurality of outlet dividers 970 in the central region 950 and the thickness 7' of the plurality of inlet dividers 960 and the plurality of outlet dividers 970 on the end regions 980 and 990 varies the channel density as a normal distribution along the +Y direction, such that regions of higher channel density remove more heat and regions of lower channel density remove lesser heat.

Figure 10A:
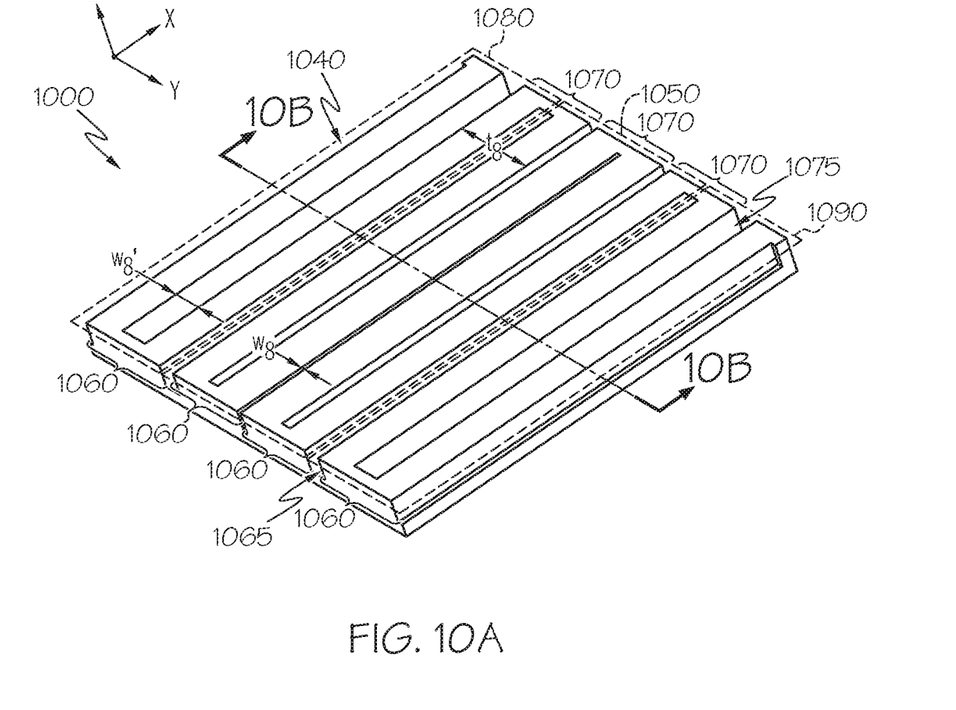
FIG. 10A depicts a top perspective view of an example insert in an MMC heat sink where a width of the inlet channels and the outlet channels in a central region of the insert is less than a width of the inlet channels and the outlet channels on either ends of the insert parallel to a plane of the target surface, according to one or more embodiments shown and described herein.
Figure 10B:
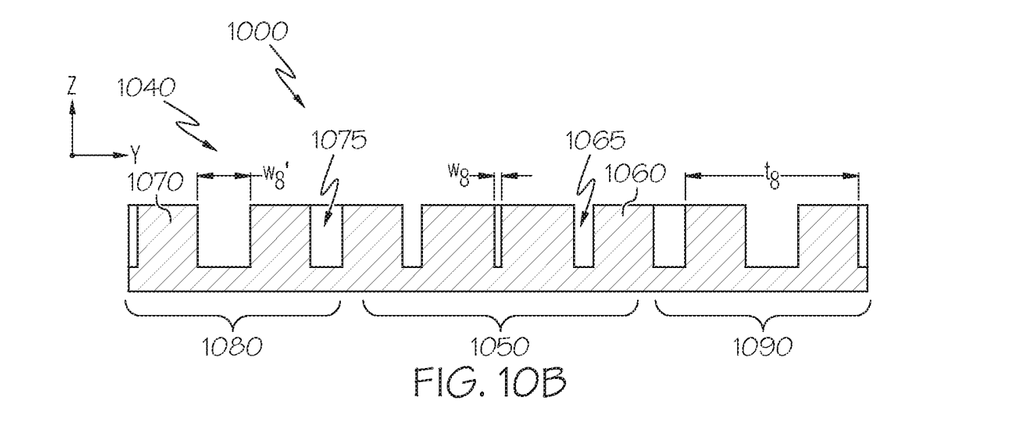
FIG. 10B depicts a cross-sectional view of the example insert in the MMC heat sink of FIG. 10A, according to one or more embodiments shown and described herein.
Figure 11:
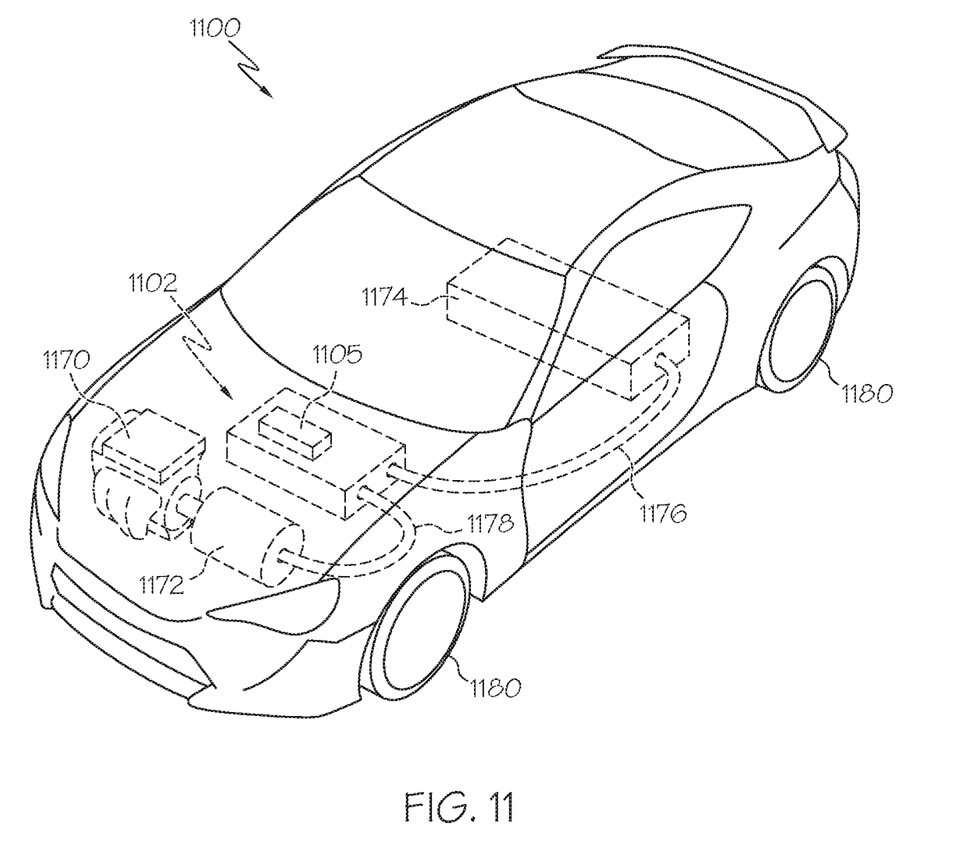
FIG. 11 schematically depicts a vehicle having an electric motor electrically coupled to an electronics module having the MMC heat sink having an example microchannel structure and an example insert, according to one or more embodiments described and illustrated herein.

FIGS. 10A-10B depict a top perspective view and a cross-sectional view respectively of yet another example insert 1040 in an MMC heat sink 1000 disposed along a plane of the target surface 112 which extends in the +X and +Y directions. The insert 1040 of the MMC heat sink 1000 has a plurality of inlet dividers 1060 and a plurality of outlet dividers 1070 having a thickness '$t_8$' and extending in a normal (+Z) direction from the target surface 112. The plurality of inlet dividers 1060 define inlet channels 1065 and the plurality of outlet dividers 1070 define the outlet channels 1075 respectively. The inlet channels 1065 and the outlet channels 1075 have a width '$w_8$' in a central region 1050 and a width '$w_8$'' in end regions 1080 and 1090 of the insert 1040 on either side of the central region 1050. In the non-limiting embodiment shown in FIGS. 10A-10B, along the +Y direction, the width $w_8$ of the inlet channels 1065 and the outlet channels 1075 in the central region 1050 of the insert 1040 is less than the width $w_8$' of the inlet channels 1065 and the outlet channels 1075 on the end regions 1080 and 1090 of the insert 1040, while the thickness $t_8$ of the plurality of inlet dividers 1060 and the plurality of outlet dividers 1070 remains constant. Variation between the width $w_8$ of the inlet channels 1065 and the outlet channels 1075 in the central region 1050 and the width $w_8$' of the inlet channels 1065 and the outlet channels 1075 on the end regions 1080 and 1090 varies the channel density as a normal distribution along the +Y direction, such that regions of higher channel density remove more heat and regions of lower channel density remove lesser heat As stated above, the electronic modules having embodiments of the MMC heat sinks described herein may be incorporated into larger power electronic circuits, such as inverter and/or converter circuits of an electrified vehicle. The electrified vehicle may be a hybrid vehicle, a plug-in electric hybrid vehicle, an electric vehicle, or any vehicle that utilizes an electric motor. Referring now to FIG. 11, a vehicle 1100 configured as a hybrid vehicle or a plug-in hybrid vehicle is schematically illustrated. The vehicle generally comprises a gasoline engine 1170 and an electric motor 1172, both of which are configured to provide rotational movement to the wheels 1180 of the vehicle 1100 to propel the vehicle 1100 down the road. A power electronic circuit 1102 is electrically coupled to electric motor 1172 (for example, by conductors 1178). The power electronic circuit 1102 may be configured as an inverter and/or a converter circuit that provides electrical power to the electric motor 1172. The power electronic circuit 1102 may in turn be electrically coupled to a power source, such as a battery pack 1174 (for example, by conductors 1176). The power electronic circuit 1102 includes one or more electronics modules 1105 having the example MMC heat sink 110 with the microchannel structure 220, as described above.

The functionally graded fin geometries of the microchannel structure and functionally graded inlet and outlet dividers of the insert of the MMC heat sinks provide efficient cooling of the heat-generating devices that generate non-uniform heat flux. Any variations of the example microchannel structures 320, 420, 520, and 620 shown in FIGS. 3A-3B, 4A-4B, 5A-5B, and 6A-6B respectively can be combined with any variations of the example inserts 740, 840, 940, and 1040 shown in FIGS. 7A-7B, 8A-8B, 9A-9B, and 10A-10B respectively to form an MMC heat sink that is tailored to extract heat from any number of heat-generating devices and their corresponding heat fluxes. By controlling the heat transfer coefficient (and thereby thermal performance) in directions of the variation in fin density and the channel density, which are perpendicular to each other, the thermal performance of the entire plane of the MMC heat sinks can be functionally graded. The MMC heat sinks can thus be advantageously used for cooling heat-generating devices in the electronics modules.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A manifold microchannel heat sink comprising: a target surface; a microchannel structure comprising: a plurality of fins extending in a normal direction from the target surface and defining a plurality of microchannels, wherein: individual fins of the plurality of fins are shaped as rectangular plates; individual microchannels of the plurality of microchannels comprise gaps between the individual fins; and the plurality of fins are distributed on the target surface such that at least a thickness of the individual fins or a width of the gaps comprising the individual microchannels is varied along a plane of the target surface; and an insert disposed over the microchannel structure, wherein: the insert has a plurality of inlet dividers and a plurality of outlet dividers; individual inlet dividers of the plurality of inlet dividers define an inlet channel; individual outlet dividers of the plurality of outlet dividers define an outlet channel, and the plurality of inlet dividers and the plurality of outlet dividers each have a thickness that is varied along the plane of the target surface.

2. The manifold microchannel heat sink of claim 1, wherein the thickness of the individual fins increases in a first direction along the plane of the target surface.

3. The manifold microchannel heat sink of claim 1, wherein the width of the gaps comprising the individual microchannels increases in a first direction along the plane of the target surface.

4. The manifold microchannel heat sink of claim 1, wherein the thickness of the individual fins in a central region of the microchannel structure is less than the thickness of the individual fins on either ends of the microchannel structure along the plane of the target surface.

5. The manifold microchannel heat sink of claim 1, wherein the width of the gaps comprising the individual microchannels in a central region of the microchannel structure is less than the width of the gaps comprising the individual microchannels on either ends of the microchannel structure along h plane of the target surface.

6. The manifold microchannel heat sink of claim 1, wherein the thickness of the plurality of inlet dividers and the plurality of outlet dividers in the insert increases in a second direction parallel to the plane of the target surface.

7. The manifold microchannel heat sink of claim 1, wherein the inlet channel of each of the individual inlet dividers and the outlet channel of each of the individual outlet dividers in the insert have a width that increases in a second direction parallel to the plane of the target surface.

8. The manifold microchannel heat sink of claim 1, wherein the thickness of the plurality of inlet dividers and the plurality of outlet dividers in a central region of the insert is less than the thickness of the plurality of inlet dividers and the plurality of outlet dividers on either ends of the insert parallel to the plane of the target surface.

9. The manifold microchannel heat sink of claim 1, wherein the width of the inlet channels and the outlet channels in a central region of the insert is less than the width of the inlet channels and the outlet channels on either ends of the insert parallel to the plane of the target surface.

10. The manifold microchannel heat sink of claim 1, wherein the microchannel structure is fabricated using one or more of the following: three-dimensional printing, rapid investment casting, and additive manufacturing.

11. An electronics module comprising: a manifold microchannel heat sink comprising: a target surface; a microchannel structure comprising: a plurality of fins extending in a normal direction from the target surface and defining a plurality of microchannels, wherein: individual fins of the plurality of fins are shaped as rectangular plates; individual microchannels of the plurality of microchannels comprise gaps between individual fins; and the plurality of fins are distributed on the target surface such that at least a thickness of the individual fins or a width of the gaps comprising the individual microchannels is varied along a plane of the target surface; and an insert disposed over the microchannel structure, wherein: the insert has a plurality of inlet dividers and a plurality of outlet dividers; individual inlet dividers of the plurality of inlet dividers define an inlet channel; individual outlet dividers of the plurality of outlet dividers define an outlet channel; and the plurality of inlet dividers and the plurality of outlet dividers each have a thickness that is varied along the plane of the target surface; and a semiconductor device thermally coupled to the target surface.

12. The electronics module of claim 11, wherein the thickness of the individual fins increases in a first direction along the plane of the target surface.

13. The electronics module of claim 11, wherein the width of the gaps comprising the individual microchannels increases in a first direction along the plane of the target surface.

14. The electronics module of claim 11, wherein the thickness of the individual fins in a central region of the microchannel structure is less than the thickness of the individual fins on either ends of the microchannel structure along the plane of the target surface.

15. The electronics module of claim 11, wherein the width of the gaps comprising the individual microchannels in a central region of the microchannel structure is less than the width of the gaps comprising the individual microchannels on either ends of the microchannel structure along the plane of the target surface.

16. The electronics module of claim 11, wherein the thickness of the plurality of inlet dividers and the plurality of outlet dividers in the insert increases in a second direction parallel to the plane of the target surface.

17. The electronics module of claim 11, wherein the inlet channel of each of the individual inlet dividers and the outlet channel of each of the individual outlet dividers in the insert have a width that increases in a second direction parallel to the plane of the target surface.

18. The electronics module of claim 11, wherein the thickness of the plurality of inlet dividers and the plurality of outlet dividers in a central region of the insert is less than the thickness of the plurality of inlet dividers and the plurality of outlet dividers on either ends of the insert parallel to the plane of the target surface.

19. The electronics module of claim 11, wherein the width of the inlet channels and the outlet channels in a central region of the insert is less than the width of the inlet channels and the outlet channels on either ends of the insert parallel to the plane of the target surface.

20. The electronics module of claim 11, wherein the microchannel structure is fabricated using one or more: three-dimensional printing, rapid investment casting, and additive manufacturing.

* * * * *

UNITED STATES PATENT AND TRADEMARK OFFICE
CERTIFICATE OF CORRECTION

PATENT NO. : 11,149,937 B2
APPLICATION NO. : 16/777403
DATED : October 19, 2021
INVENTOR(S) : Yuqing Zhou and Ercan Mehmet Dede It is certified that error appears in the above-identified patent and that said Letters Patent is hereby corrected as shown below:

On the Title Page

Item (74), attorney, agent, or firm, after "Dinsmore & Shohl", delete ",".

In the Specification

In Column 2, Line(s) 49, after "individual", delete "ins" and insert --fins--, therefor.

In Column 9, Line(s) 3, after "thickness", delete "7'" and insert --$t_7$'--, therefor.

In the Claims

In Column 11, Line(s) 2, in Claim 5, before "plane", delete "h" and insert --the--, therefor.

Signed and Sealed this
Twenty-first Day of December, 2021

Drew Hirshfeld
*Performing the Functions and Duties of the*
*Under Secretary of Commerce for Intellectual Property and*
*Director of the United States Patent and Trademark Office*